(12) United States Patent
Schwarz

(10) Patent No.: US 11,282,823 B2
(45) Date of Patent: Mar. 22, 2022

(54) SEMICONDUCTOR DEVICE

(71) Applicant: OSRAM OLED GmbH, Regensburg (DE)

(72) Inventor: Thomas Schwarz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/757,270

(22) PCT Filed: Oct. 16, 2018

(86) PCT No.: PCT/EP2018/078251
§ 371 (c)(1),
(2) Date: Apr. 17, 2020

(87) PCT Pub. No.: WO2019/076898
PCT Pub. Date: Apr. 25, 2019

(65) Prior Publication Data
US 2021/0194590 A1    Jun. 24, 2021

(30) Foreign Application Priority Data
Oct. 18, 2017    (DE) ...................... 10 2017 124 321.6

(51) Int. Cl.
*H04B 10/00*    (2013.01)
*H01L 25/16*    (2006.01)
(Continued)

(52) U.S. Cl.
CPC ......... *H01L 25/167* (2013.01); *H04B 10/502* (2013.01); *H05B 45/20* (2020.01); *H05B 47/185* (2020.01)

(58) Field of Classification Search
CPC .... H04B 10/116; H04B 10/502; H04B 10/40; H04B 10/504; H01L 25/167; H01L 25/16; H01L 33/06; H01L 33/58
(Continued)

(56) References Cited

U.S. PATENT DOCUMENTS 8,521,035 B2 *    8/2013    Knapp ................. H04L 12/437
398/172
2006/0273331 A1    12/2006    Lim et al.
(Continued)

FOREIGN PATENT DOCUMENTS

| CN | 203492237 U | 3/2014 |
| EP | 2846611 A1 | 3/2015 |
| GB | 2467797 A | 8/2010 |

OTHER PUBLICATIONS

Christopher Bower, "Heterogeneous integration of microdevices by transfer printing", X-Celeprint, Dec. 17, 2015, 35 pages.
(Continued)

*Primary Examiner* — Hanh Phan
(74) *Attorney, Agent, or Firm* — Hauptman Ham, LLP

(57) ABSTRACT

A semiconductor device with at least one radiation emitting optical semiconductor chip, an integrated circuit, and exactly two connecting contacts. The semiconductor device has a variable radiation characteristic which is controlled as a function of a voltage signal both for data transmission and for supplying the semiconductor device which can be applied to the connecting contacts and varied over time.

19 Claims, 10 Drawing Sheets

(51) Int. Cl.
  *H05B 45/20* (2020.01)
  *H05B 47/185* (2020.01)
  *H04B 10/50* (2013.01)

(58) Field of Classification Search
  USPC ....... 398/172, 128, 130, 135, 136, 118, 119, 398/182, 189, 187, 186, 201, 158, 159; 257/80, 98, 89, 88
  See application file for complete search history.

(56) References Cited

U.S. PATENT DOCUMENTS

| | | | |
|---|---|---|---|
| 2007/0295975 A1 | 12/2007 | Omae | |
| 2009/0297166 A1* | 12/2009 | Nakagawa | H04B 10/1149 398/172 |
| 2012/0269520 A1 | 10/2012 | Hong et al. | |
| 2015/0181668 A1 | 6/2015 | Chang et al. | |
| 2016/0198551 A1* | 7/2016 | Kelly | H05B 45/3725 315/291 |
| 2017/0133356 A1 | 5/2017 | Mercier et al. | |

OTHER PUBLICATIONS

"5mm Round Standard T-1 ¾ Type Full Color Blinking LED Technical Data Sheet, Part No. LL-F506RGBC2E-F1", Lucky Light Electronics Co., Ltd., Sep. 28, 2015, 13 pages.
"Preliminary WS2801 3-Channel Constant Current LED Driver With Programmable PWM Outputs", Worldsemi, WS-Preliminary-V0.3, http://www.world-semi.com, World Semiconductor, Inc, Nov. 2008, 15 pages.
"WS2812B Intelligent control LED integrated light source", Worldsemi, http:// www.world-semi.com, 6 pages, 2020.
"WS2813 Intelligent control integrated LED light source", http://www.world-semi.com, Worldsemi Co., Limited, Oct. 2016, 11 pages.
"WS2811 Signal line 256 Gray level 3 channal Constant current LED drive IC", worldsemi, http://www.world-semi.com, 7 pages, 2020.
"Elektronik Kompendium, Powerline-Kommunikation / Powerline Communications (PLC)", <http://www.elektronikkompendium.de/sites/kom/0310061.htm>, accessed May 11, 2020, along with an English translation, 17 pages.
"1-Wire", Wikipedia, <https://de.wikipedia.org/wiki/1-Wire>, accessed May 11, 2020, along with an English translation, 8 pages.
"Duplex (communications technology)", Wikipedia, <https://de.wikipedia.org/wiki/Flash-Speicher>, accessed May 11, 2020, along with an English translation, 5 pages.
"Flash memory", Wikipedia, <https://de.wikipedia.org/wiki/Flash-Speicher>, accessed May 11, 2020, along with an English translation, 16 pages.
"I²C", Wikipedia, <https://de.wikipedia.org/wiki/I%C2%B2C>, accessed May 11, 2020, along with an English translation, 15 pages.
"Serial Peripheral Interface", Wikipedia, <https://de.wikipedia.org/wiki/Serial_Peripheral_Interface>, along with an English translation, 8 pages, 1987.
"Carrier frequency system", Wikipedia, <https://de.wikipedia.org/wiki/Tr%C3%A4gerfrequenzanlage>, along with an English translation, 15 pages, 2009.
"USB", Wikipedia, <https://en.wikipedia.org/wiki/USB>, 16 pages, 1996.
International Search Report issued for corresponding International Patent Application No. PCT/EP2018/078251 dated Jan. 24, 2019, along with an English translation.
Written Opinion issued for corresponding International Patent Application No. PCT/EP2018/078251 dated Jan. 24, 2019.
Search Report issued for corresponding German Patent Application No. 10 2017 124 321.6 dated Apr. 30, 2018.
"2 Pin 5mm RGB Multi Color Changing Flashing LED", Hacktronics, <https://hacktronics.co.in/through-hole-led/2-pin-5mm-rgb-multi-color-changing-flashing-led> (retrieved Apr. 16, 2020).

* cited by examiner

SEMICONDUCTOR DEVICE

CROSS REFERENCE TO RELATED APPLICATION

This application is a National Stage of International Application No. PCT/EP2018/078251, filed on Oct. 16, 2018, which designates the United States and was published in Europe, and which claims priority to German Patent Application No. 10 2017 124 321.6, filed on Oct. 18, 2017, in the German Patent Office. Both of the aforementioned applications are hereby incorporated by reference in their entireties.

The application concerns a semiconductor device with a radiation-emitting optical semiconductor chip.

Radiation-emitting optical semiconductor devices comprise one or more LEDs. Those with several LEDs are also called multi LEDs. The optical semiconductor devices have several connecting contacts by means of which they can be connected and supplied with current and voltage. Data is transmitted to the semiconductor device via further connecting contacts.

Conventional optical semiconductor devices with only two connecting contacts only allow the supply of the semiconductor device and have a predetermined radiation characteristic that is not changeable during operation.

Optical semiconductor devices that can be controlled during operation have separate connecting contacts for supply and control. Usually there are at least four pins, two for applying the supply voltage and two for data transmission. This allows, for example, control data to be transmitted for three channels in which several LEDs are connected in series. Arrangements with several semiconductor devices can be controlled via a serial bus for data transmission, to which the semiconductor devices are connected and via which the data is transferred from semiconductor device to semiconductor device. Pulse width modulation is usually used as the modulation method for data transmission.

The task is to provide a simpler optical semiconductor device.

The task is solved by a semiconductor device with at least one radiation-emitting optical semiconductor chip, an integrated circuit and exactly two connecting contacts. The semiconductor device has a variable radiation characteristic which is controlled as a function of a voltage signal both for data transmission and for supplying the semiconductor device which can be applied to the connecting contacts and varied over time. The radiation characteristic is changed depending on the voltage signal. The emitted radiation is usually light in the visible and/or non-visible range.

The provision of only two connecting contacts, via which both the control of the semiconductor device during operation as well as its supply is carried out, is accompanied by a compact design. The radiation characteristics of the emitted radiation may include brightness and/or color. This means that the semiconductor device can emit radiation in different colors and at different levels of brightness, but it has only two electrical connecting contacts. The colors and brightness are freely adjustable, can be changed during operation and can be programmed from the outside. The radiation characteristic can be changed alternatively or additionally with regard to the radiation profile. Due to misaligned lenses on the semiconductor chips, especially µLEDs, an LED could radiate in one direction, for example to the right, and an LED in the other direction, for example to the left. Depending on which LED is energized, the radiation profile of the semiconductor device changes. In addition to the beam direction, the width of the radiation could also be adjusted in this way.

The semiconductor device is a mechanical unit, but it can be composed of several elements. The semiconductor device can be a chip with a carrier of semiconductor material on which an electronic circuit and/or conductor structures are applied and on which the connecting contacts and radiation-emitting optical semiconductor chips are arranged.

The integrated circuit is an electronic circuit mounted on a semiconductor material wafer. Such an integrated circuit is also called an IC. For particularly small dimensions the designation µIC is also used.

For example, the radiation-emitting semiconductor chip can be an LED chip with an active, light-emitting region on a semiconductor substrate. More than one radiation-emitting semiconductor chip may be provided, for example two chips of different color, whose color and/or brightness is controlled and variable via the connecting contacts. One design can be an RGB LED chip with several light emitting surfaces and several transistors in the integrated circuit, which nevertheless has only two connecting contacts. A combination of a conventional integrated circuit and several LED chips is also conceivable.

The semiconductor device can be contacted and controlled from outside via the connecting contacts. When the semiconductor device is installed in an arrangement, electrically conductive connections to the semiconductor device are made via the connecting contacts.

Only two lines are required for the wiring. If the optical semiconductor device is mounted on a package with common ground, even only one line is required. System costs can thus be saved. In the automotive industry, for example, wire harness costs account for a not inconsiderable proportion of costs. The wiring of decorative or Christmas tree decorations with such semiconductor devices is thinner and more filigree than with conventional arrangements; it is also easier to lay. For new applications such as displays in textiles, simple wiring on two levels is made possible. In some cases even a single layer wiring is possible. By using µAICs, chip costs and thus component costs can be significantly reduced.

In one design, the two connecting contacts are located on a top of the semiconductor device. In another design, they may be located on the bottom of the semiconductor device. Alternatively, one of the connecting contacts is located on the top and the other connecting contact on the bottom.

A design of the semiconductor device further comprises a substrate on top of which the at least one optical semiconductor chip and the integrated circuit are arranged. In this case the integrated circuit is located next to the optical semiconductor chips. Contact regions of the integrated circuit may be located on its top or bottom, or on both top and bottom.

In one design, the integrated circuit has at least one optical semiconductor chip on top of it, so that the integrated circuit is located under the optical semiconductor chips. In this design, the substrate is dispensable; instead, the optical semiconductor chips are deposited on the semiconductor material wafer of the integrated circuit serving as a carrier.

The semiconductor chip may have a tear-off point and/or the integrated circuit may have a tear-off point. The semiconductor chip may have a ridge-like projection with the tear-off point at its end and/or the integrated circuit may have a ridge-like projection with the tear-off point at its end. It should be noted that the integrated circuit and the optical semiconductor chips mounted on the substrate have a tear-off point on a ridge-like projection or a tear-off point on their outer surface when mounted by the parallel transfer process described below. The same applies to optical semiconductor chips mounted on the integrated circuit. They have a tear-off point on a ridge-like projection or a tear-off point on their outside if they have been mounted in the parallel transfer process described below.

Power supply and data transmission are based on the same voltage signal. It has a supply voltage component for supplying the semiconductor device, which is usually a DC component, and a data signal component for transmitting data for controlling the radiation characteristic so that the voltage signal varies around the DC component.

In one design, the voltage signal is a pulse-width modulated signal with a DC component, so that the data feed is modulated via pulse-width modulation to the voltage supply.

In one design, the voltage signal is a frequency shift keyed signal with a DC component, so that the data feed is modulated via frequency modulation to the voltage supply. By using frequency modulation, the circuitry can be kept to a minimum, but the reliability of data transmission can be significantly increased, as there are fewer problems with regard to electromagnetic compatibility (EMC).

The voltage signal may have a synchronization signal section in data pauses when no data is transmitted.

The voltage signal varies between a high level above an average supply voltage level and a low level below the average supply voltage level. The low level is greater than a voltage required to operate the semiconductor device, so that there is always a sufficient supply to the semiconductor device regardless of the data transmission.

The integrated circuit comprises contact regions for applying the voltage signal and at least one contact region for electrical connection to the at least one optical semiconductor chip. It further comprises a decoder adapted to demodulate the data signal portion and to provide the demodulated data, at least one current source for supplying the at least one optical semiconductor chip, a current source controller adapted to provide at least one pulse-width modulated signal for controlling the at least one current source, and a memory coupled between the decoder and the current source controller and adapted to provide data for the current source controller. This arrangement allows the decoding of the voltage signal, and the control of the radiation characteristic via the current sources for the optical semiconductor chips. The memory can also be called RGB memory, which has control data for, for example, three channels of three-color optical semiconductor chips. The current source is a constant current source that feeds the optical semiconductor chip. It can be switched on and off by the current source control, which generates the pulse-width modulated signal, depending on this pulse-width modulated signal, making the radiation dimmable. The decoder includes an active bandpass filter to filter out the frequency components of a frequency-sampled voltage signal.

In one design, the integrated circuit further comprises an address memory in which an address associated with the semiconductor device is stored, and an address comparator adapted to compare whether an address information in the demodulated data matches the address associated with the semiconductor device. This allows the address to be compared with data transmitted via a bus for several semiconductor devices.

In one design, the integrated circuit further comprises a reference voltage source coupled to the at least one current source and adapted to drive the same. In the simplest case, only a fixed reference voltage is provided to control the current. This can also be changed via an interface for current programming in order to influence the current and thus the radiation characteristic.

In one design, the integrated circuit also includes a calculator which enables, for example, address comparison and/or control of the reference voltage source and thus of the current. Means for error detection and handling during operation of the optical semiconductor chips, especially LED chips, may be provided. This allows defective LED chips and incorrect data to be detected.

An encoder may be provided to modulate data to be transmitted by the semiconductor device as data signal component of the voltage signal. In this way data can be written to the transmitter.

The invention is illustrated below by the drawing in the following figures.

FIG. 1A shows an exemplary embodiment of a semiconductor device 1 in side view. FIG. 1B shows the exemplary embodiment in top view.

Figure 1A:
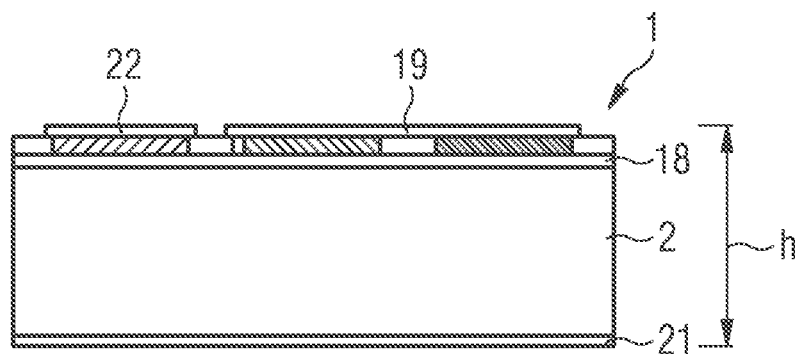
FIGS. 1A and 1B show an exemplary embodiment of a semiconductor device in side view and top view.

The semiconductor device 1 is a controllable RGB LED chip with a red LED chip 11, a green LED chip 12 and a blue LED chip 13 as exemplary embodiments of radiation emitting optical semiconductor chips arranged on a substrate 2. Since several LED chips 11, 12, 13 are provided, the semiconductor device 1 can also be called a multi-LED.

Substrate 2 is preferably electrically conductive, e.g. of doped silicon, or has conductive structures, and it is metallized on its bottom. An integrated circuit (IC) 15 is also applied to the substrate 2. Contact regions 17, also known as "pads", are provided on the top of the integrated circuit 15.

Conductor structures 18 run on a top of the substrate 2 to the contact regions 17 of the integrated circuit 15 and form electrically conductive connections between the contact regions 17 of the integrated circuit 15 and contact regions of the LED chips 11, 12, 13 on their bottoms. The LED chips 11, 12, 13 are mounted on the conductor structures 18. An electrically conductive, translucent layer 19 is provided on the LED chips 11, 12, 13.

Thus, not only the integrated circuit 15 and the LED chips 11, 12, 13 are applied to the top of the substrate 2, but also at least one metallization layer with conductor structures 18 for wiring the components 11, 12, 13, 15. Two or more wiring layers 18, 19 are conceivable.

The semiconductor device 1 also has a first connecting contact 21 on its bottom, which is formed by the flat metallization, and a second connecting contact 22 on the top, which is also metallic and is electrically conductively connected to the integrated circuit 15 by means of the conductor structure 18.

The following dimensions of the design example are exemplary. The height h is in the range of 120 μm. The length l is in the range of 300 μm. The width b is in the range of 200 μm. Semiconductor devices with an area of 1 mm² or larger are also conceivable. Length and width of the square LED chips 11, 12, 13 are about 40 μm.

Due to their small size, the LED chips 11, 12, 13 and the integrated circuit 15 are also called μLEDs or AICs.

The semiconductor device 1 has a variable radiation characteristic which is controlled in dependence of a time-variable voltage signal $V_{1-2}$ which can be applied to the connecting contacts 21, 22 and which both supplies semiconductor device 1 with voltage and transmits data for control. The radiation characteristic can be changed during operation, for example, with regard to brightness and color.

A potential $V_{1-2}$ can be applied to the first connecting contact 21, which is also led to the LED chips 11, 12, 13 and the integrated circuit 15. The reference potential GND can be led to the integrated circuit 15 and to the LED chips 11, 12, 13 via the second connecting contact 22, at which a reference potential GND is applied.

Semiconductor device 1 described above can be manufactured as a wafer composite, so that manufacturing steps for a plurality of semiconductor devices 1 can be carried out in parallel. These manufacturing steps include in particular the application or growth of layers and structures and, if necessary, their partial removal. Only in a final step are the semiconductor devices 1 singulated.

The LED chips 11, 12, 13 and the integrated circuit 15 are applied to the substrate 2 by means of so-called transfer printing. This is a parallel assembly process in which the integrated circuits 15 are placed on a target substrate 54, which is later singulated. The assembly is carried out for all subsequent semiconductor devices 1 in a compound and simultaneously by transferring a plurality of integrated circuits 15 from a source wafer 52 to the target substrate 54 by means of an elastomer stamp and placing them on the target substrate 54 in such a way that the integrated circuits 15 are located at their intended positions on the subsequent semiconductor devices 1. The stamp plate has a structure that corresponds to the size and positions of the integrated circuits 15 on the target substrate 54.

The integrated circuits 15 are also manufactured in parallel on the source wafer 52 in a wafer compound, with the integrated circuits 15 being arranged in a grid pattern in such a way that a plurality of integrated circuits 15 are connected to each other and to the wafer substrate via retaining structures 30. The chips are held in the source substrate with so-called tethers until they are broken out during the printing process. During parallel transfer, the stamp is pressed onto the integrated circuits 15 to be transferred so that they adhere to the stamp. As soon as the stamp moves in the opposite direction, the integrated circuits 15 are separated from the retaining structures 30. A tear-off point 39 remains on the integrated circuit 15, which may be located on a ridge-like projection 38, which is part of the retaining structure 30. The integrated circuit 15 may have several tear-off points, which are located in the side or bottom area. The assembly process is very cost-effective because it can be carried out in parallel.

The thickness of integrated circuits 15 manufactured in this way can be significantly less than that of conventionally singulated chips. The IC size, for example, is about 30×40 μm. The thickness is about 5 μm.

Figure 2A:
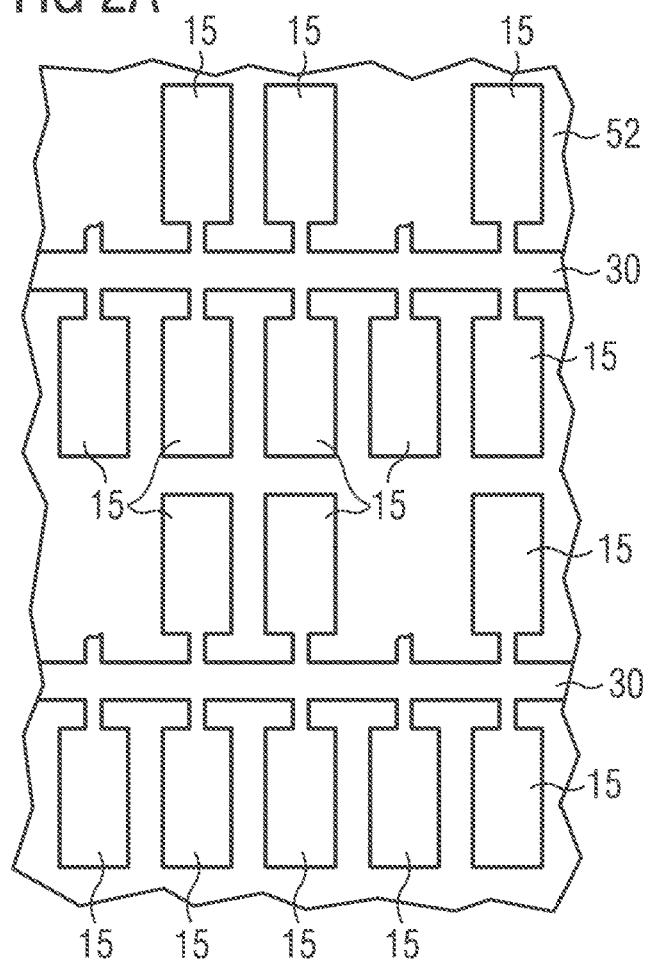
FIGS. 2A and 2B show a source wafer and a target substrate during parallel transfer.
Figure 2B:
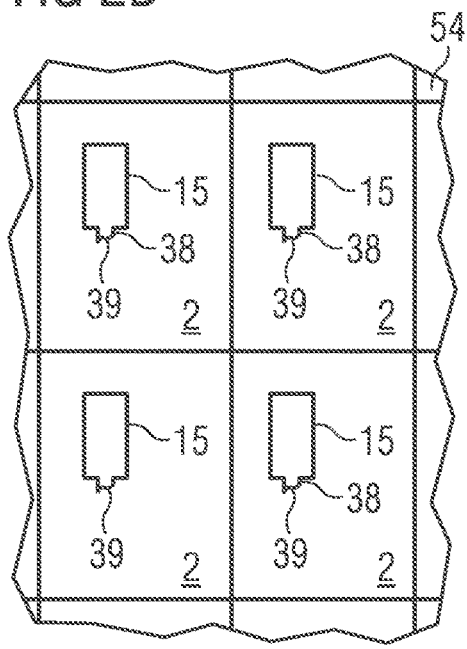

FIG. 2A shows a schematic illustration of the source wafer 52 with a plurality of integrated circuits 15 and the retaining structure 30, by which the integrated circuits 15 are connected. Some integrated circuits 15 have been transferred from source wafer 52 to target substrate 54 via the parallel assembly process. FIG. 2B shows a schematic illustration of the target substrate 54, which is later singulated into substrate wafers 2 of the semiconductor devices 1.

The integrated circuits 15 have already been placed on the target substrate 54 which have been removed from the source wafer 52 corresponding to their position on the target wafer 54 and transferred to the target substrate 54 by means of the stamp.

In the detached integrated circuit 15, the tear-off point 39 is located on a ridge-like projection 38, which is part of the retaining structure 30. Alternatively, the tear-off point 39 can be located directly on an outside of the integrated circuit 15.

In the parallel assembly process, a plurality of integrated circuits 15 is transferred simultaneously. Then the conductor structure 18 is applied, which is to continuously connect the contact regions 17 of the integrated circuits 15 via the substrate 2 with the LED chips 11, 12, 13. In further steps, the LED chips 11, 12, 13, each of which was also produced in a compound on a source wafer, are placed on the target substrate 54 with the parallel transfer described above and connected to the conductor structures 18. In further production steps, the second connecting contacts 22 and the translucent, conductive layer 19 are applied to the LED chips 11, 12, 13. Finally, the semiconductor devices 1 are singulated. By using thin-film wiring techniques on the target substrate, the pad sizes can be selected to be particularly small, for example in the range of 5 μm. Examples of such techniques are the so-called PI or planar interconnect technology, where a structured, planar metal layer is provided as the electrical connection, the so-called RDL or redistribution layer technology, i.e. a rewiring technology, or photo technology and thin film metal deposition and lift-off technology. This allows the further reduction of the chip. Direct integration with LEDs on the same substrate is thus possible.

Figure 1B:
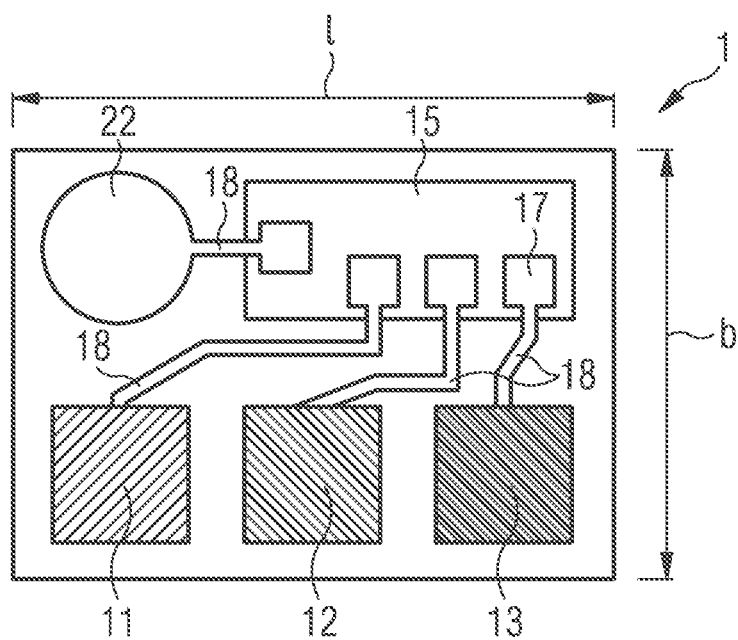
Figure 3A:
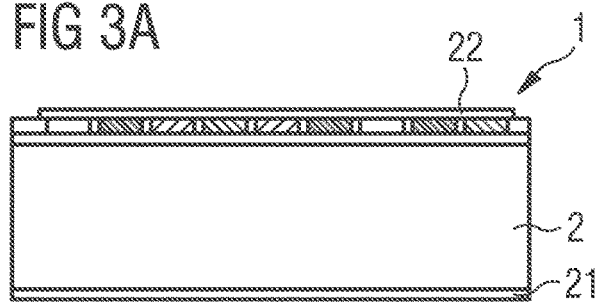
FIGS. 3A and 3B show an exemplary embodiment of a semiconductor device in side view and top view.
Figure 3B:
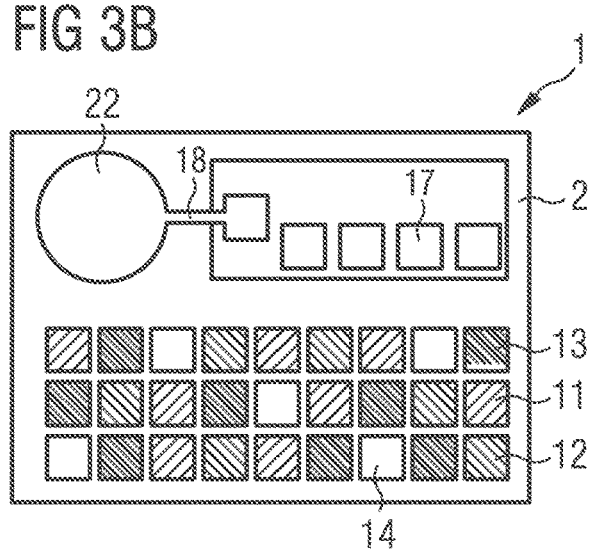

FIG. 3A shows an exemplary embodiment of a semiconductor device 1 in side view. FIG. 3B shows the exemplary embodiment of semiconductor device 1 in top view. In order to avoid repetition, only the differences to the exemplary embodiment shown in FIGS. 1A and 1B will be discussed.

In this exemplary embodiment, many small LED chips 11, 12, 13, 14 of different colors, namely red, green, blue and white, are applied in a mixed arrangement on substrate 2. Via metal structural layers on substrate 2, these can be connected in series or in series or both alternately. A possible connection is a series connection of all LED chips 11, 12, 13, 14 of the same color.

In this design example, because of the LED chips 11, 12, 13, 14 in four colors, the integrated circuit 15 also has four contact regions 17 for connecting the LEDs 11, 12, 13, 14 and one for connecting to the second connecting contact 22. The integrated circuit 15 is connected via the latter upper contact region 17 to the external power supply and the data signals and is connected with its bottom to the first connecting contact 21. Instead of the upper contact regions 17, it is also possible to arrange them on the bottom of the integrated circuit 15 in order to apply the integrated circuit 15 in flip-chip contacting on the substrate 2.

The integrated circuit 15 and the LED chips 11, 12, 13, 14 can have all contact regions 17 on the bottom, or all contact regions 17 on the top, or partially contact regions 17 on the bottom and partially contact regions 17 on the top.

Figure 4A:
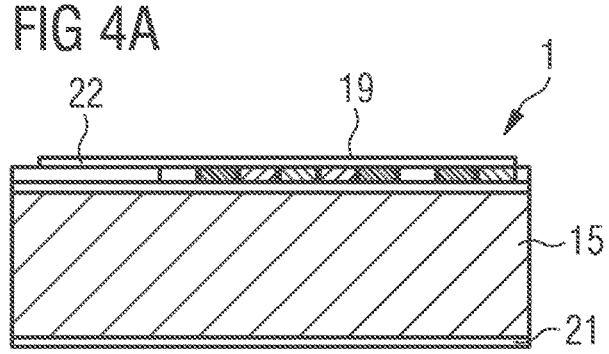
FIGS. 4A and 4B show an exemplary embodiment of a semiconductor device in side view and top view.
Figure 4B:
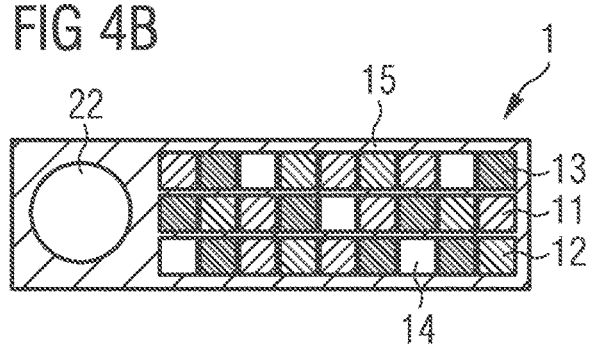

FIG. 4A shows an exemplary embodiment of a semiconductor device 1 in side view. FIG. 4B shows the exemplary embodiment of semiconductor device 1 in top view. This exemplary embodiment differs from the previous one essentially in that the integrated circuit 15 also takes over the carrier function of the substrate 2, as the LED chips 11, 12, 13, 14 are arranged on it.

The semiconductor device 1 comprises the integrated circuit 15, on which a multiplicity of LED chips 11, 12, 13, 14 of different colors, namely red, green, blue and white, are mounted in a mixed arrangement. The integrated circuit 15 takes over the function of substrate 2, as described in the previous exemplary embodiments. Via metal structural layers on the integrated circuit 15, the LED chips 11, 12, 13, 14 can be connected in series or serially or both alternately. A possible connection is the series connection of all LED chips 11, 12, 13, 14 of the same color. Alternatively, direct connection of the LED chips 11, 12, 13, 14 in flip-chip contact with contact regions 17 on the top of the integrated circuit 15 is possible.

The integrated circuit 15 has a metal layer on its bottom as the first connecting contact 21 and a second metal connecting contact 22 on its top. The LED chips 11, 12, 13, 14 are connected via a conductive, translucent layer 19 on the LED chips 11, 12, 13, 14.

The design described above with an integrated circuit 15 as carrier for the LED chips 11, 12, 13, 14 makes sense if the same or more IC area is required as the area required for the LED chips 11, 12, 13, 14 or if the integrated circuit 15 is large enough for cost-effective conventional chip mounting. This is the case, for example, with a size of more than 150×150 μm.

Semiconductor device 1 has a radiation characteristic which can be changed during operation, for example with regard to brightness and/or color, which is controlled as a function of the time-variable voltage signal $V_{1-2}$ which can be applied to the connecting contacts 21, 22, which both supplies semiconductor device 1 with voltage and transmits data for control.

Figure 5:
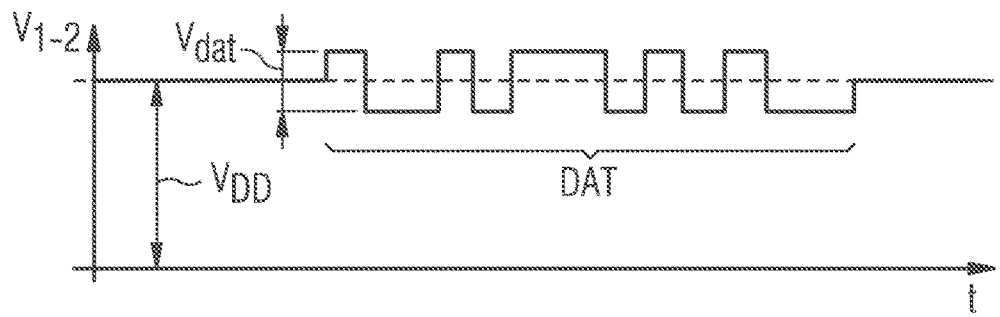
FIGS. 5, 6, 7 and 8 show voltage signal curves as a function of time.

FIG. 5 illustrates the supply and control of a semiconductor device 1, the possible structure of which has been described in the preceding exemplary embodiments in connection with FIGS. 1A, 1B, 3A, 3B, 4A, 4B.

The signal curve of the voltage signal $V_{1-2}$ applied between the connecting contacts 22, 21 is illustrated as a function of the time t.

The voltage signal $V_{1-2}$ consists of a constant voltage supply for the LED chips 11, 12, 13, 14 and the integrated circuit 15 and a modulated data signal. The former is the supply voltage level $V_{DD}$. The modulated data signal moves between a high and a low level around the supply voltage level $V_{DD}$ with the level $V_{dat}$.

In this exemplary embodiment, the DAT data is digitally modulated by pulse width modulation, so that the information is contained in the length of the pulses.

If no data transmission is required, for example after setting the radiation characteristic, it is no longer necessary to transmit data DAT. Only the supply voltage level $V_{DD}$ for maintaining the operation of semiconductor device 1 with the set radiation characteristic is present during the data pause.

Figure 6:
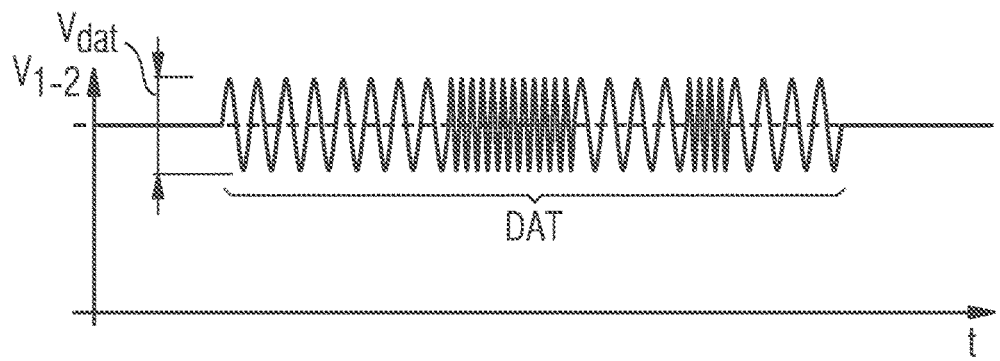

FIG. 6 illustrates the supply and control of a semiconductor device 1, the possible structure of which has been described in the preceding exemplary embodiments in connection with FIGS. 1A, 1B, 3A, 3B, 4A, 4B.

The signal curve of the voltage signal $V_{1-2}$ applied between the connecting contacts 21, 22 is illustrated as a function of the time t.

To avoid repetition, only the differences to FIG. 5 are described. In this exemplary embodiment, the data DAT is modulated between the high and low levels by means of frequency modulation, or more precisely frequency shift keying (FSK). One bit value is encoded by a sine wave at a first frequency and the other bit value is encoded by a sine wave at a second frequency different from the first frequency.

Figure 7:
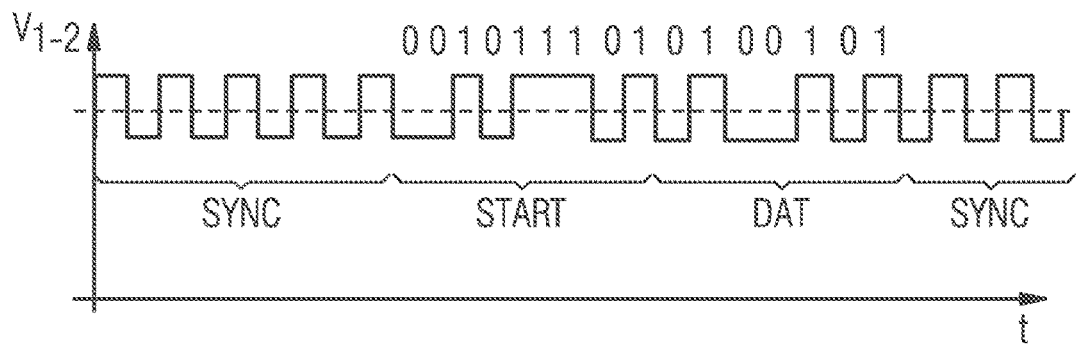

FIG. 7 illustrates the supply and control of a semiconductor device 1, the possible structure of which has been described in the preceding exemplary embodiments in connection with FIGS. 1A, 1B, 3A, 3B, 4A, 4B.

The signal curve of the voltage signal $V_{1-2}$ applied between the connecting contacts 21, 22 is illustrated as a function of the time t. To avoid repetition, only the differences to FIG. 5 are described. In contrast to that exemplary embodiment, in the exemplary embodiment shown in FIG. 7 a pulse width signal is modulated on the power supply even if no data is transmitted. This offers the advantage that during this time, i.e. the data pause, a SYNC synchronization signal can be transmitted between the transmitter and receiver.

The data signal can include a start sequence START, which signals that the actual information data DAT will be transmitted afterwards. For example, the data sequence 0010111 indicates the start of the data transmission. This is followed by the information data DAT, which can also contain crosssum bits. The synchronization signal SYNC does not always have to be present when no data transmission is taking place. Only the supply voltage level $V_{DD}$ can be applied.

Figure 8:
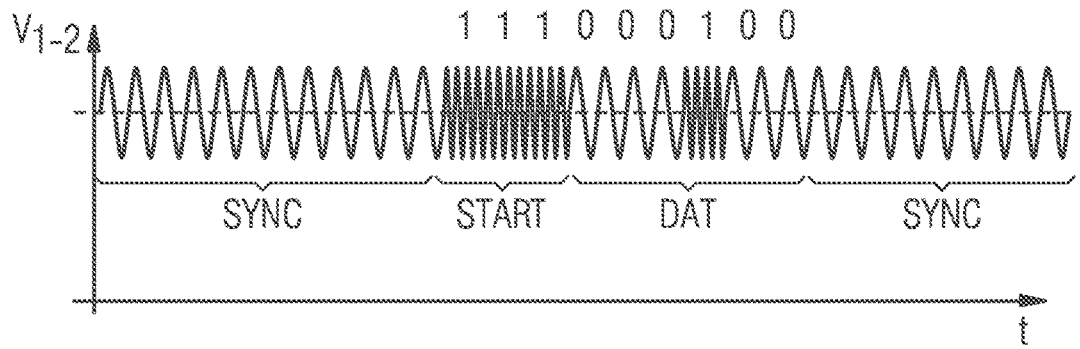

FIG. 8 illustrates the supply and control of a semiconductor device 1, the possible structure of which has been described in the preceding exemplary embodiments in connection with FIGS. 1A, 1B, 3A, 3B, 4A, 4B.

The FSK signal curve of the voltage signal $V_{1-2}$ applied between the connecting contacts 21, 22 is illustrated as a function of the time t.

To avoid repetition, only the differences to FIG. 6 are described. In contrast to that exemplary embodiment, in the exemplary embodiment illustrated in FIG. 8 an FSK signal is modulated on the power supply even during data pauses. This offers the advantage that a SYNC synchronization signal can be transmitted between the transmitter and receiver during this time.

The data signal can include a start sequence START, which signals that data DAT will be transmitted afterwards. For example, the data sequence 111 indicates the start of the information data transfer. After the start sequence START comes the information data DAT, which may also contain crosssum bits. The synchronization signal SYNC does not always have to be present when no data transmission is taking place. Only the supply voltage level $V_{DD}$ can be applied.

The FSK signal offers the advantage that the voltage supply always remains constant on average. With pulse width modulation, the average voltage changes with varying data content. If many bits 0 are transmitted, the supply voltage drops. With many bits 1 it rises. Another advantage of FSK modulation is that it is not very susceptible to interference because it has a narrow spectrum. It works with only two frequencies, which can be filtered out well at the receiver. The square wave signal of a pulse width modulation has a much wider spectrum because the steep edges have many frequency components. The signal smears more easily during transmission and reception, and false data may occur. With FSK modulation, the signal generation effort is higher, but if the communication is only unidirectional, the effort does not exist in semiconductor devices 1. Thus a simple circuit can be realized there as well.

Figure 9:
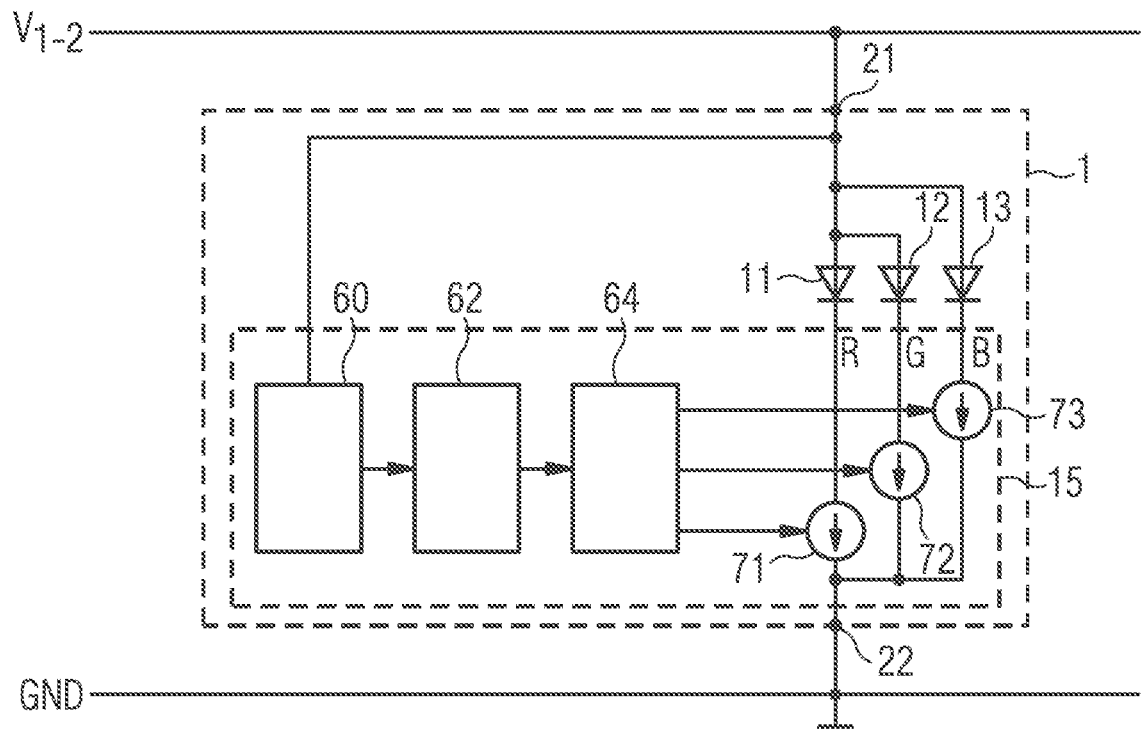
FIG. 9 shows a schematic circuit diagram for an exemplary embodiment of a semiconductor device.

FIG. 9 shows a schematic circuit diagram for an exemplary embodiment of a semiconductor device 1.

The semiconductor device 1 has only two connecting contacts 21, 22, and the potential $V_{1-2}$ and the reference potential GND is applied via the first and second connecting contacts 21, 22.

In the LED chips 11, 12, 13 the anodes of the LEDs are short-circuited and connected to the first connecting contact 21, so that the potential $V_{1-2}$ is applied. The LED chips 11, 12, 13 are connected on the cathode side to the integrated circuit 15 via its contact regions R, G, B.

The integrated circuit 15 includes a decoder 60, a memory 62 and a current source controller 64, as well as a current source 71, 72, 73 for each LED chip 11, 12, 13. The current sources 71, 72, 73 are constant current sources and each provide a constant current, but are switchable by the current source controller 64 to dim the LED chips 11, 12, 13. The decoder 60 demodulates the voltage signal $V_{1-2}$, especially its data signal component, into a digital data sequence which is written synchronously into memory 62. Using the data from memory 62, the LEDs are driven by means of the current source control 64, which generates pulse width modulation signals to control the current sources 71, 72, 73 and thus the LED chips 11, 12, 13, by switching the current sources 71, 72, 73 off and on. The LED chips 11, 12, 13 are each operated with a current source 71, 72, 73, which is controlled by one of the pulse width signals. The data depth for a color can be only eight bits, but it can also be more than 20 bits.

Figure 10:
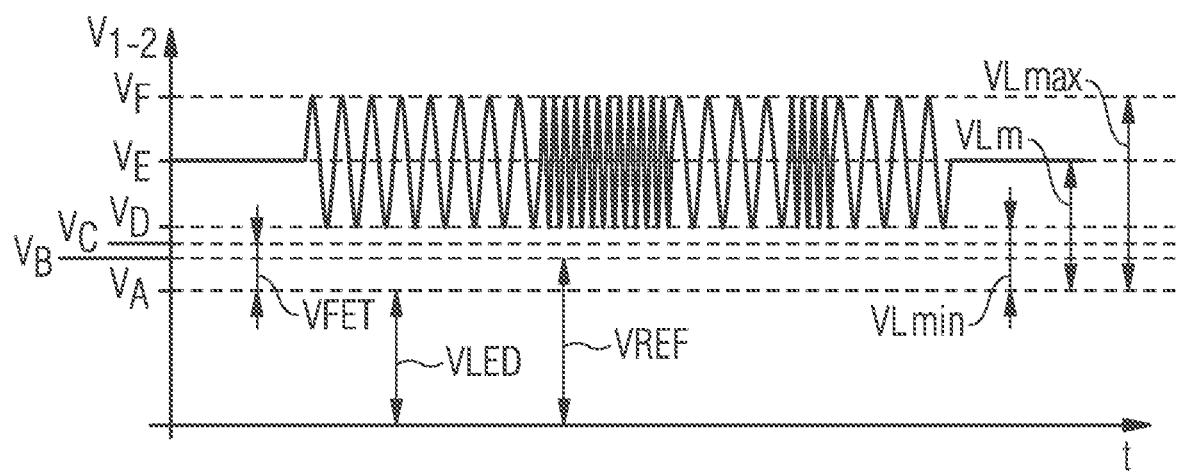
FIG. 10 shows a voltage signal curve as a function of time.

FIG. 10 illustrates the voltage and data supply and the voltage components of the voltage signal $V_{1-2}$ in a possible operating mode of semiconductor device 1 on the basis of a signal curve of the voltage signal $V_{1-2}$ as a function of time t. The voltage signal $V_{1-2}$ is frequency shift keyed. If no data is transmitted, it has a constant value, which is the average supply voltage $V_E$. During data transmission it oscillates between a maximum level $V_F$ and a minimum level $V_D$.

A so-called forward voltage is required for the LEDs in series with the current sources to switch to the conductive state. A current source usually contains at least one field effect transistor. A voltage VFET drops across this in the open case. $V_c$ is the highest forward voltage that takes into account both a voltage VLED, which is required to operate the LED, and the voltage VFET, which is applied to the transistor controlling the LED. In the diagram, the voltage level of the voltage required to operate the LEDs is designated $V_A$.

For the safe operation of the current sources 71, 72, 73 a reference voltage VREF is often necessary. This can be obtained from the voltage signal $V_{1-2}$. The voltage level $V_B$ is the reference voltage VREF for the current sources 71, 72, 73.

In this operating mode the minimum voltage $V_D$ is higher than the forward voltage $V_c$. The LED is insensitive to the modulated data signals, as there is always sufficient voltage available for its operation. It can always be lit and does not have to be switched off for programming. The excess voltage drops at the current source.

If the maximum voltage $V_F$ is applied, there is a maximum loss at the current source, referred to as VLmax; if the minimum voltage $V_D$ is applied, there is a minimum loss at the current source, referred to as VLmin. When the average supply voltage $V_E$ is applied, an average loss, called VLm, occurs.

The disadvantage of the circuit in this operating mode is that the higher the signal amplitude, the higher the thermal losses. However, high signal amplitudes are desirable for long transmission distances and high interference immunity.

Another possible operating mode is to select $V_D<V_C$, i.e. to lower the minimum voltage $V_D$ below the forward voltage $V_C$. In this case a smoothing of the voltage signal $V_{1-2}$ is necessary to ensure that the LEDs are always supplied with sufficient voltage. During smoothing, the data information is lost. This step requires large capacities that cannot be miniaturized. These would have to be mounted outside the chip.

Figure 11:
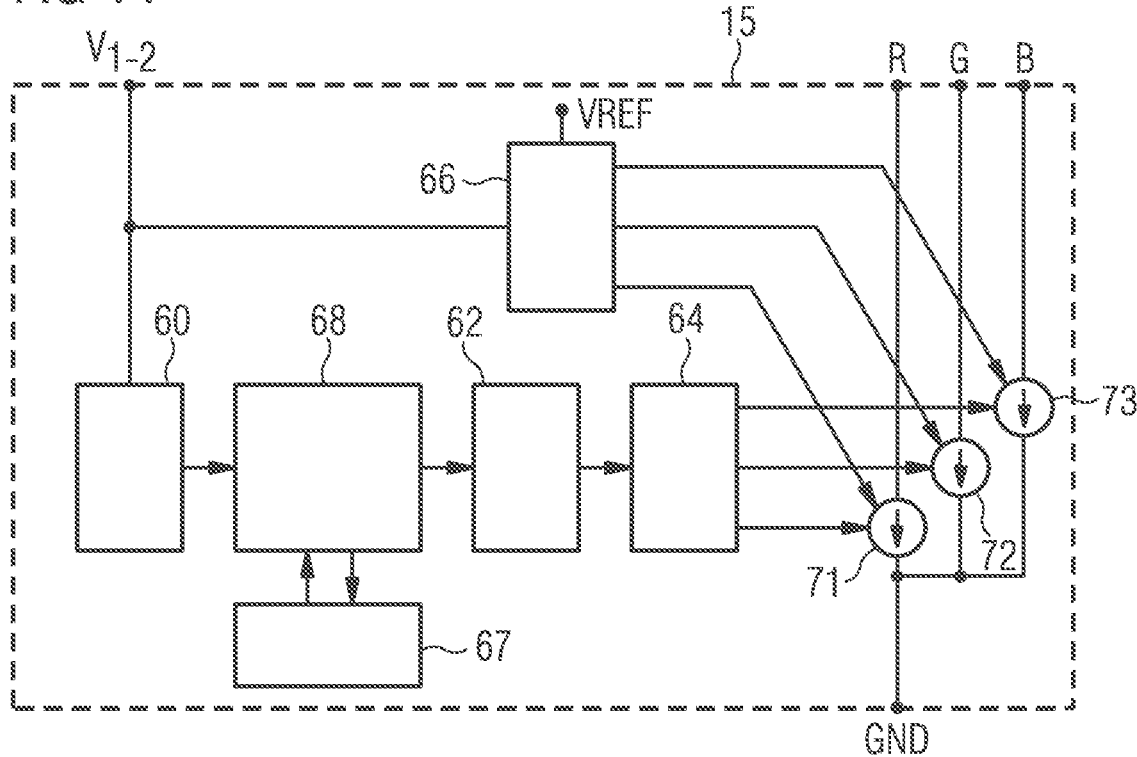
FIG. 11 shows a schematic circuit diagram for an exemplary embodiment of an integrated circuit of a semiconductor device.

FIG. 11 shows a schematic circuit diagram for an exemplary embodiment of an integrated circuit 15 of a semiconductor device 1 with only two connecting contacts 21, 22.

To avoid repetition, the description focuses on differences to the exemplary embodiment described in FIG. 9.

Contact regions 17 for applying the potential $V_{1-2}$ and the reference potential GND as well as contact regions R, G, B for connecting the LED chips 11, 12, 13 in three different colors are provided on integrated circuit 15.

In addition to the elements of the exemplary embodiment described in FIG. 9, the integrated circuit 15 includes a reference voltage source 66. The reference voltage VREF provided by it can, for example, be generated by a Zener diode. The reference voltage source 66 is useful for operating the constant current sources 71, 72, 73 to which it is coupled. In addition, the reference voltage VREF can also be used to operate gates for the remaining logic.

In this exemplary embodiment, the integrated circuit 15 further comprises an address comparator 68 downstream of the decoder 60, which is coupled to an address memory 67, for example an address EEPROM. They provide addressing functionality: Each integrated circuit 15 has its own fixed address, stored in a ROM, or changeable address, stored in an EEPROM. The address is a sequence of numbers. The data signal for such a semiconductor device 1 starts with the address of the semiconductor device 1 for which the data is intended. In semiconductor device 1 the address of the incoming data signal is compared with the internally stored address. If the addresses match, the data is intended for this semiconductor device 1 and is loaded into memory 62 downstream of address comparator 68. Using the data from memory 62, the LEDs are controlled by means of the current source control 64, which generates pulse width signals to drive the LED chips 11, 12, 13.

Figure 12:
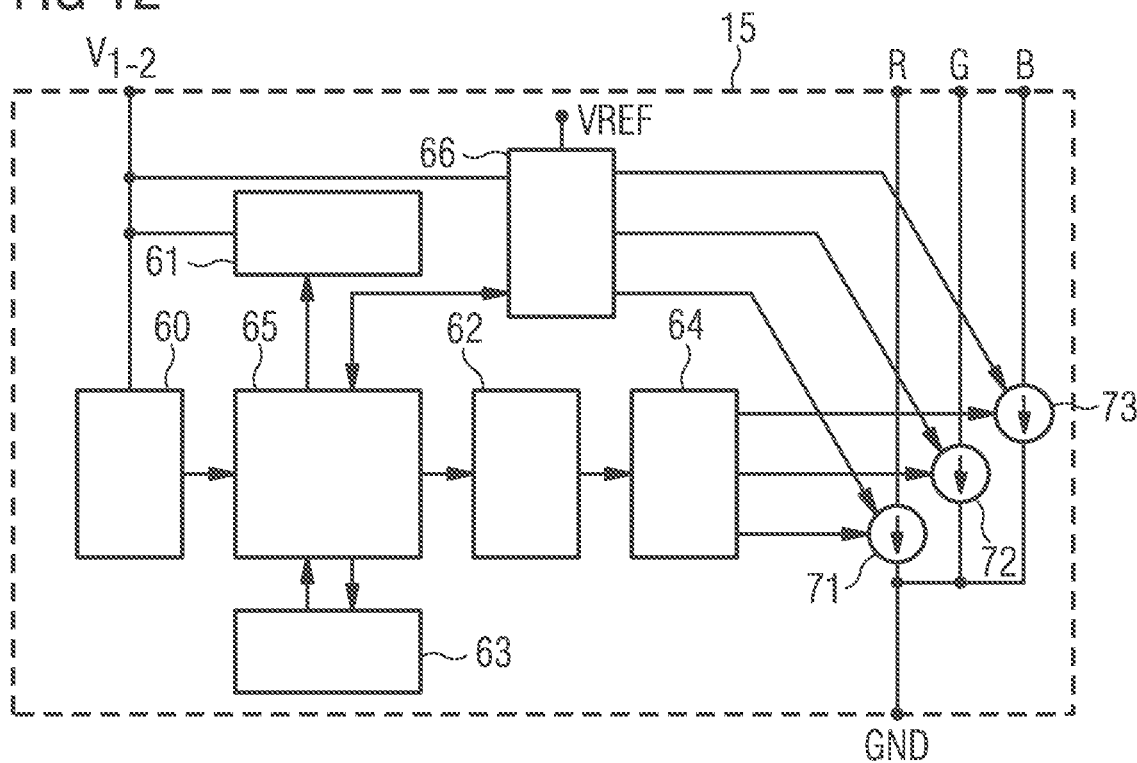
FIG. 12 shows a schematic circuit diagram for an exemplary embodiment of an integrated circuit of a semiconductor device.

FIG. 12 shows a schematic circuit diagram for an exemplary embodiment of an integrated circuit 15 of a semiconductor device 1 with exactly two connecting contacts 21, 22.

In order to avoid repetition, the description focuses on differences to the exemplary embodiment described above.

In this highest stage of expansion shown, the integrated circuit 15 comprises a calculator 65, for example a controller, which is coupled between the decoder 60 and the memory 62. A controller of small size is also called a µcontroller. The calculator 15 is coupled with a memory, for example EEPROM, memory 63, in which address and calibration information is stored. The EEPROM memory 63 thus contains not only the chip address but also data for the calibration of the LEDs.

In addition, an encoder 61 is provided, which is coupled with the calculator 65 and the contact region 17 for the supply potential $V_{1-2}$. Encoder 61 is suitable for sending information back to the transmitter by modulating the voltage signal $V_{1-2}$ at the connecting contacts 21, 22 depending on the data to be transmitted.

The reference voltage source 66 also enables error detection and processing with regard to LED chips 11, 12, 13. This functionality is also called "error handling". For this purpose the reference voltage source 66 is coupled with the calculator 65. The reference voltage source 66 detects defective LEDs, for example, and is able to write back or send this information. In response to a defective LED, for example, it can be switched off. The constant current sources 71, 72, 73 can be programmed or changed via a programming function in reference voltage source 66.

Figure 13:
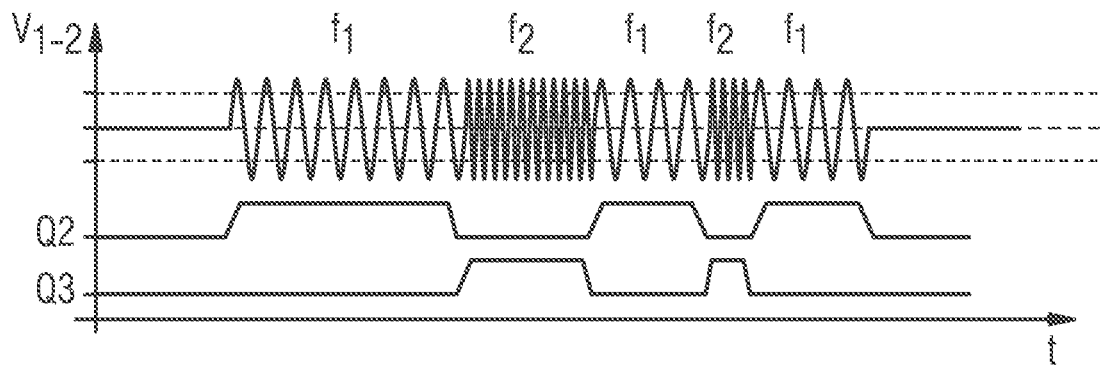
FIG. 13 shows a voltage signal curve and the curves of two decoded signals as a function of time.

FIG. 13 illustrates the decoding of a frequency shift keyed signal using the curve of the voltage signal $V_{1-2}$ and two decoded signals Q2 and Q3 as a function of time t.

During data transmission, the frequency-shift keyed voltage signal $V_{1-2}$ is switched between a first frequency f1 and a second frequency f2.

The first decoded signal Q2 has a first, high level if the first frequency f1 is present and otherwise a second, low level. This corresponds to a binary signal with the transmitted data information. The second decoded signal Q3 has a first, high level if the second frequency f2 is present and otherwise a second, low level. This corresponds to a binary signal with the transmitted data information. In data transmission the first and second decoded signals Q2, Q3 are complementary to each other. If no data is transmitted, they have the same low level, which indicates a data pause.

Figure 14:
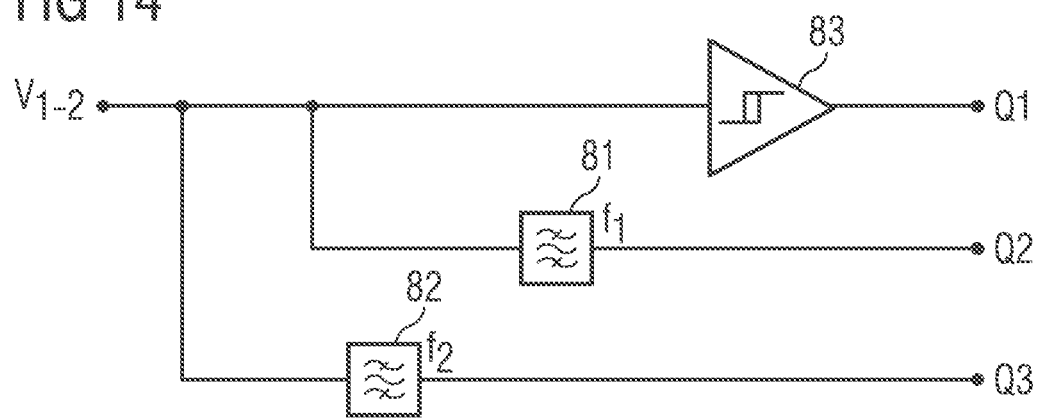
FIG. 14 shows an exemplary embodiment of a decoder.

FIG. 14 schematically shows a decoder which can be used to provide the first and second decoded signals Q2, Q3 from the voltage signal $V_{1-2}$.

Active bandpass filters can be used to decode the FSK signal. The decoder includes a first bandpass filter 81, a second bandpass filter 82 and a Schmitt trigger 83.

With the first filter 81 with the pass frequency f1 the lower frequency signal is filtered out and provided as the first decoded signal Q2. The second filter 82 with the pass frequency f2 filters out the higher frequency signal and provides the second decoded signal Q3. For synchronization, a synchronization signal Q1 is extracted with a Schmitt trigger 83.

Figure 15:
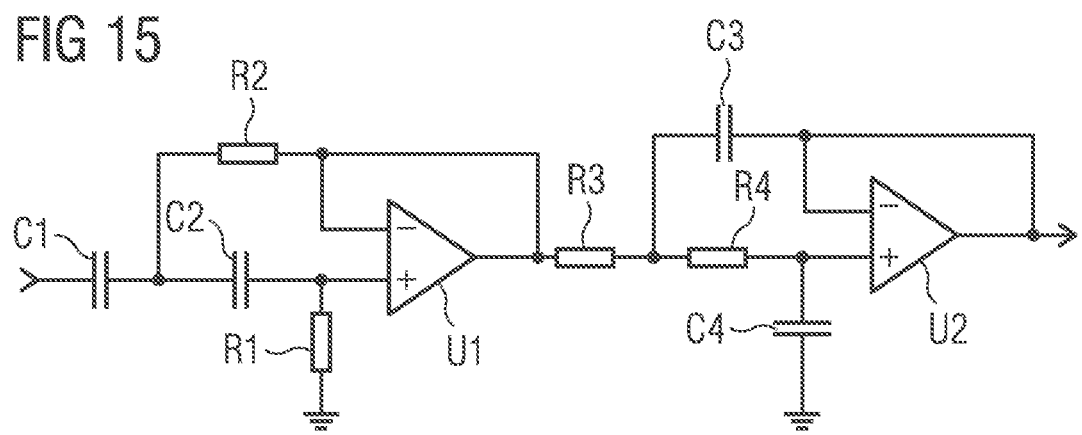
FIG. 15 shows an exemplary embodiment of a bandpass filter.

FIG. 15 shows an exemplary embodiment of an active electronic filter: a Sallen Key bandpass that includes operational amplifiers and several resistors and capacitors.

The filter comprises a first and second operational amplifier U1, U2. One input of the first operational amplifier U1 is connected to a series circuit of a first and a second capacitor C1, C2. A first resistor R1 is coupled between this input and a reference potential. A second resistor R2 is coupled between a potential node between the first and second capacitors C1, C2 and the other input of the first operational amplifier U1, which is connected to its output.

Between the output of the first operational amplifier U1 and an input of the second operational amplifier U2 a series connection of a third and fourth resistor R3, R4 is coupled. A fourth capacitor C4 is coupled between this input and the reference potential. A third capacitor C3 is coupled between a potential node between the third and fourth resistors R3, R4 and the other input of the second operational amplifier U2, which is connected to its output.

Figure 16:
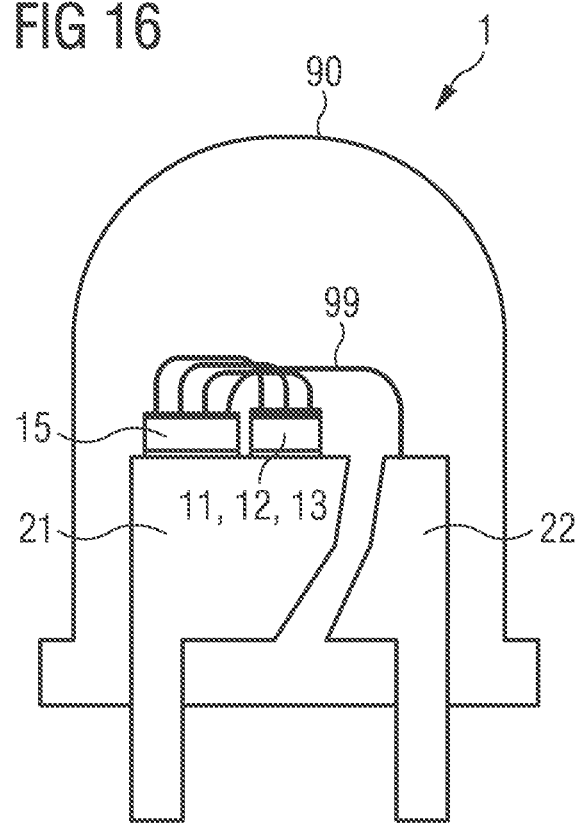
FIG. 16 shows an exemplary embodiment of a semiconductor device with housing.

FIG. 16 shows an exemplary embodiment of a semiconductor device with two leaded radial LED-type contacts with a radiation-transmitting housing 90, which is both an embedding and a lens. The device has several LED chips 11, 12, 13 and an integrated circuit 15 as a separate component. The electrical connection between LED chips 11, 12, 13, the integrated circuit 15 and at least one of the connecting contacts is made by means of wire contacts 99, also known as bonding wires. The semiconductor device 1 has a changeable radiation characteristic, which is controlled as a function of the voltage signal $V_{1-2}$, thus allowing free programming. Power supply and data transmission is carried out as described above.

Figure 17:
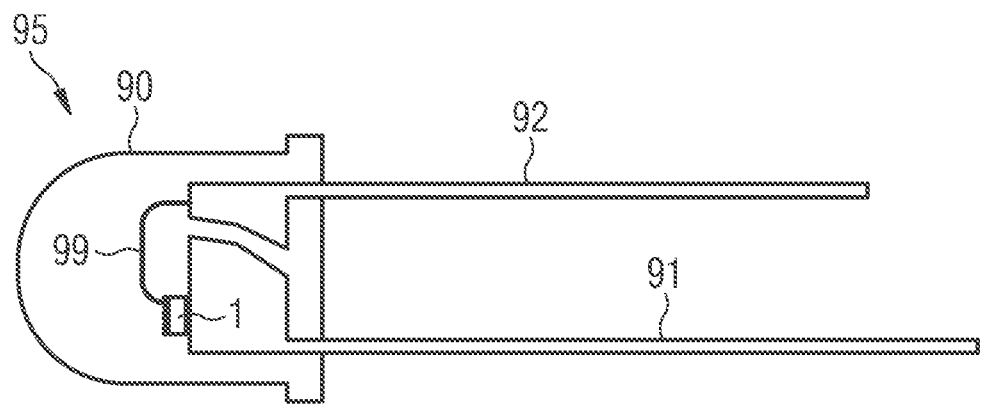
FIG. 17 shows an exemplary embodiment of a semiconductor device in a housing.

FIG. 17 shows an exemplary embodiment of a component 95, which differs from the previous one in that the semiconductor device 1 is an RGB LED chip as described in connection with FIGS. 1, 3 and 4, for example, and is housed in a package 90 with two contact legs 91, 92, designed as a leaded radial LED component 95. A connecting contact of semiconductor device 1 is connected to a leg 91 via its bottom. The other connecting contact is connected to the other leg 92 via a wire connection 93. Only a wire connection between this leg 92 and the second connecting contact 22 is required.

Figure 18:
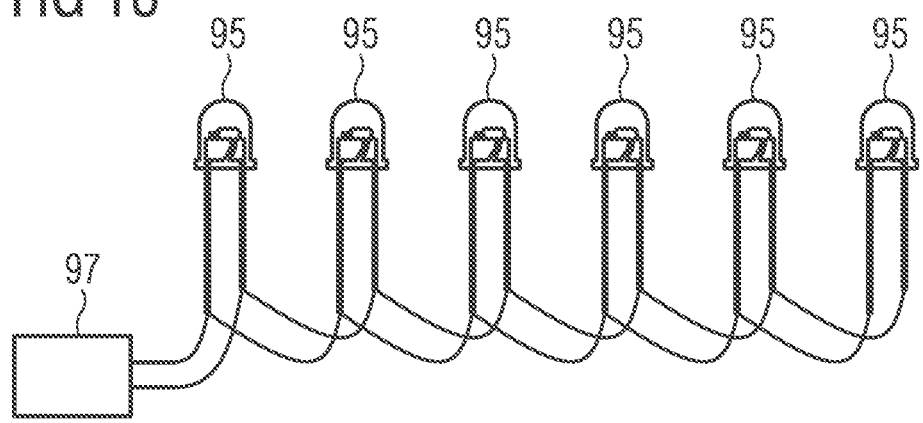
FIG. 18 shows an exemplary embodiment of an arrangement with several semiconductor devices.

FIG. 18 shows an arrangement of several parallel connected components 95, as described in connection with FIG. 16, on a control unit 97. The semiconductor devices 1 are supplied with power and data via the control unit 97, which generates the voltage signal $V_{1-2}$. In this case the semiconductor devices 1 are not individually addressable. All semiconductor devices 1 light up with changeable, same color and brightness. Such an arrangement without addressing the semiconductor devices 1 can be used for example as decorative lighting.

Figure 19A:
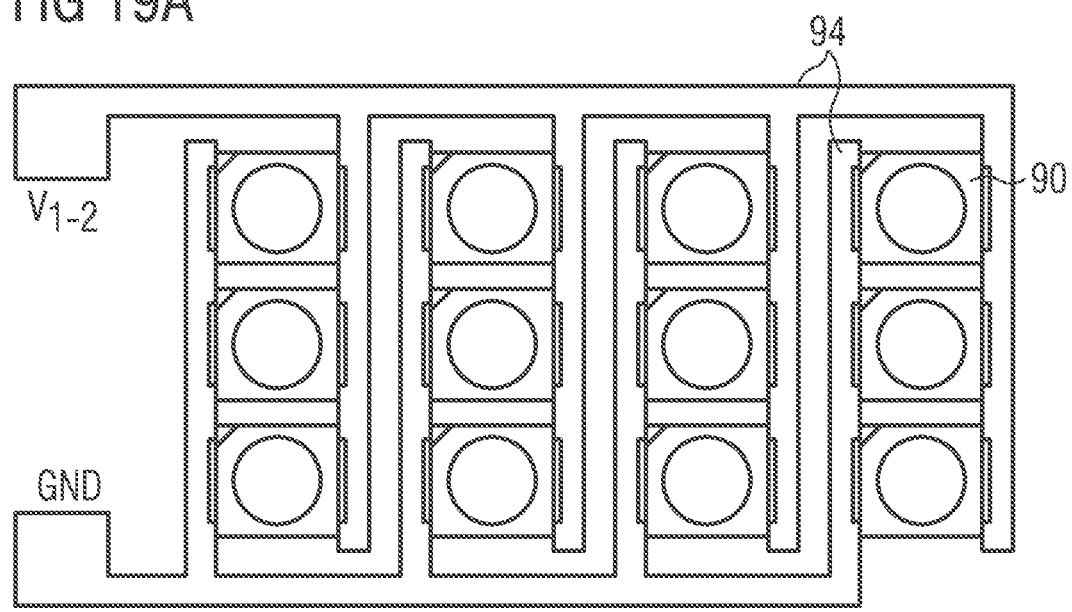
FIGS. 19A and 19B show an exemplary embodiment of an arrangement with several semiconductor devices in side view and top view.
Figure 19B:
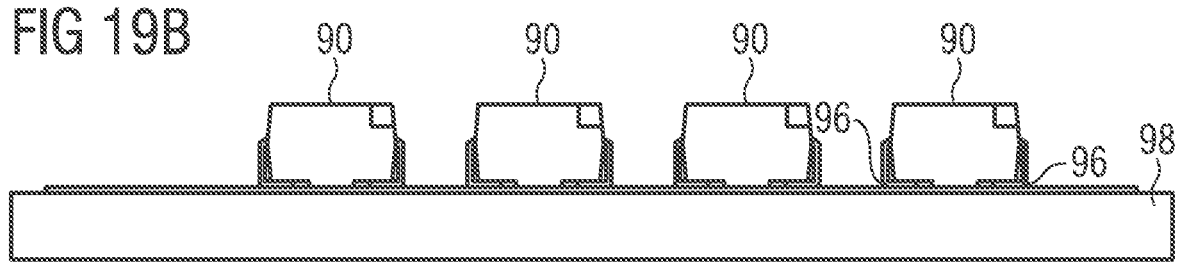

FIG. 19A shows an exemplary embodiment of an arrangement of several semiconductor devices 1 in package 90 in top view. FIG. 19B shows the side view of the exemplary embodiment.

In this exemplary embodiment, RGB LED chips are inserted as semiconductor devices 1 in a pre-molded package 90. The radiation is emitted to the top side. Contact elements 96 arranged at the rear and connected to the connecting contacts 21, 22 are connected on a single-layer printed circuit board 98. The chips are arranged in a matrix. The voltage signal $V_{1-2}$ is applied to the contact elements 96 via two comb-shaped conductor structures 94 on the circuit board 98 for the potential $V_{1-2}$ and the reference potential GND. Due to the double comb structure of the conductor structures 94, all components can be supplied with data and power. If each semiconductor device 1 has an individual address, a simple display can be realized. However, the data for each pixel must be written serially. Therefore high resolutions and refresh rates are not possible.

Figure 20A:
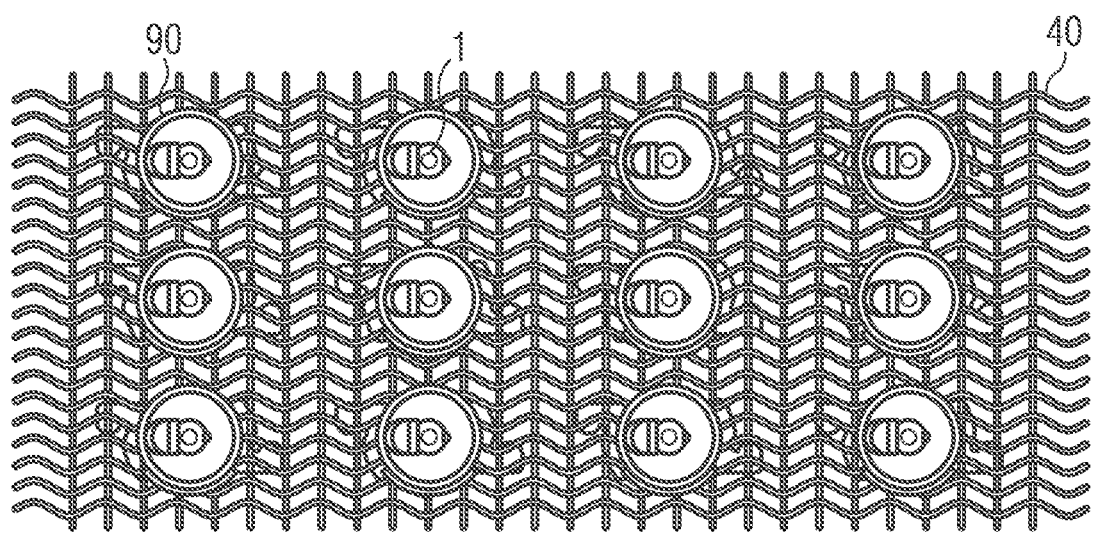
FIGS. 20A and 20B show an exemplary embodiment of an arrangement with several semiconductor devices in side view and top view.
Figure 20B:
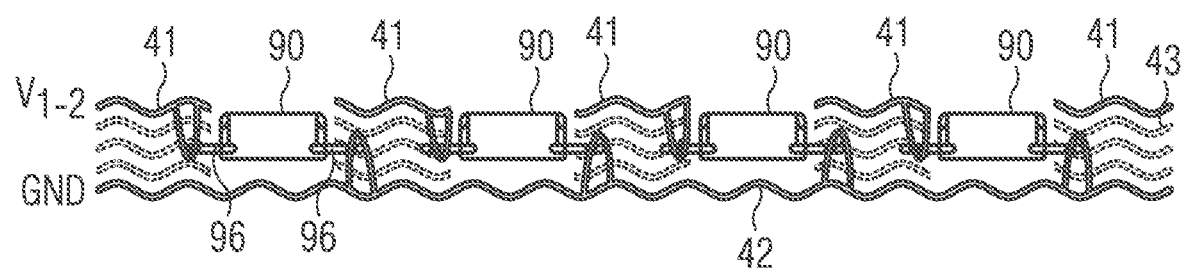

FIG. 20A shows an exemplary embodiment of an arrangement of several semiconductor devices 1 in top view. FIG. 20B shows the side view of the exemplary embodiment.

In this exemplary embodiment, the semiconductor devices are 1 RGB LED chips, which are placed in a pre-molded package 90. The radiation is emitted to the top side. Contact elements 96 connected to the connecting contacts 21, 22 protrude laterally from the rear. The chips are arranged in a matrix.

The voltage supply is provided by a fabric 40 with conductive and insulating fibers 41, 42, 4. The first are for the supply of the potential $V_{1-2}$ and the reference potential GND. Fibers 41 for applying the potential $V_{1-2}$ run at the top and fibers 42 for applying the reference potential run at the bottom, or vice versa. Between these fibers 41, 42 insulating fibers 43 are arranged. The electrical connection is made from above or below via a conductive loop to contact element 96, which is a flexible, textile display. The semiconductor devices 1 in package 90 are incorporated into the weave 40. The upper and lower weave layers are electrically conductive. The intermediate layer or layers are not conductive.

Displays with such a simple design are also interesting for textiles, e.g. to alternately create different warning symbols, for example for construction workers or police officers.

The features of the exemplary embodiment can be combined. The invention is not limited by the description based on the exemplary embodiments. Rather, the invention comprises any new feature as well as any combination of features, which includes in particular any combination of features in the claims, even if this feature or combination itself is not explicitly stated in the claims or exemplary embodiments.

REFERENCE SIGNS 1 semiconductor device
2 substrate
11, 12, 13, 14 LED Chips
15 integrated circuit
17, R, G, B contact region
18 conductor structure
19 conducting layer
21, 22 connecting contact
30 retaining structure
38 projection
39 tear-off point
40 weave
41, 42, 43 fibres
52 source wafer
54 target substrate
60 decoder
61 encoder
62, 63, 67 memory
64 current source controller
65 calculator
66 reference voltage source
68 address comparator
71, 72, 73 power source
81, 82 bandpass filter
86 schmitt trigger
90 housing
91, 92 contact leg
94 conductor structure
95 device
96 contact element
97 control unit
98 printed circuit board
99 wire contact
C1, C2, C3, C4 capacitor
DAT data
f1, f2 frequency
GND reference potential
l, h, b length, height, width
Q1, Q2, Q3 signal
R1, R2, R3, R4 resistance
START start sequence
SYNC synchronisation signal
t time
U1, U2 amplifier
$V_{1-2}$, Vdat, $V_{DD}$, VREF,
VLED, VFET, VLmin,
VLm, VLmax, $V_A$, $V_B$, $V_C$, $V_D$, $V_E$, $V_F$, voltage

The invention claimed is:

1. A semiconductor device with
at least one radiation emitting optical semiconductor chip,
an integrated circuit,
exactly two connecting contacts,
wherein the semiconductor device has a variable radiation characteristic which is controlled as a function of a voltage signal both for data transmission and for supplying the semiconductor device which can be applied to the connecting contacts and varied over time and wherein the voltage signal comprises a supply voltage component for supplying the semiconductor device and a data signal component for transmitting data for controlling the radiation characteristic, and
wherein the integrated circuit comprises:
contact regions for the voltage signal,
at least one contact region for electrical connection to the at least one optical semiconductor chip,
a decoder adapted to demodulate the data signal portion and provide the demodulated data,
at least one current source for supplying the at least one optical semiconductor chip,
a current source controller adapted to provide at least one pulse width modulated signal for controlling the at least one current source,
a memory coupled between the decoder and the current source controller and adapted to provide data for the current source controller.

2. The semiconductor device according to claim 1,
wherein the radiation characteristic comprises brightness and/or radiation profile and/or radiation direction and/or radiation width and/or color.

3. The semiconductor device according to claim 1,
wherein the two terminal contacts are arranged on a top of the semiconductor device or are arranged on a bottom of the semiconductor device or one of the connecting contacts is arranged on the top and one of the connecting contacts is arranged on the bottom.

4. The semiconductor device according to claim 1,
further comprising a substrate on top of which the at least one optical semiconductor chip and the integrated circuit are arranged.

5. The semiconductor device according to claim 1,
wherein the at least one optical semiconductor chip is arranged on the integrated circuit.

6. The semiconductor device according to claim 1,
the semiconductor chip having a tear-off point at the end of a projection and/or wherein the integrated circuit has a tear-off point at the end of a projection.

7. The semiconductor device according to claim 1,
wherein the voltage signal is a pulse width modulated signal
or wherein the voltage signal is a frequency shift keyed signal.

8. The semiconductor device according to claim 1,
wherein the voltage signal varies between a high level above an average supply voltage level and a low level below the average supply voltage level, and wherein the low level is greater than a voltage required for operating the semiconductor device.

9. The semiconductor device according to claim 1, wherein the voltage signal comprises a synchronization signal section in data pauses.

10. The semiconductor device according to claim 1, wherein the decoder comprises an active bandpass filter.

11. The semiconductor device according to claim 1, wherein the integrated circuit further comprises
an address memory in which an address associated with the semiconductor device is stored, and
an address comparator adapted to compare whether an address information in the demodulated data matches the address associated with the semiconductor device.

12. The semiconductor device according to claim 1, wherein the integrated circuit further comprises:
a reference voltage source coupled to the at least one current source and adapted to drive the same.

13. The semiconductor device according to claim 1, wherein the integrated circuit further comprises
a calculator,
means for error detection and handling during operation of the optical semiconductor chips.

14. The semiconductor device according to claim 1, wherein the integrated circuit further comprises:
an encoder for modulating data to be transmitted by the semiconductor device as data signal component of the voltage signal.

15. The semiconductor device according to claim 1, wherein the voltage signal is a frequency shift keyed signal with a DC component, so that the data feed is modulated via frequency modulation to the voltage supply.

16. The semiconductor device according to claim 1, wherein the integrated circuit has a size of about 30×40 µm and a thickness of about 5 µm.

17. A semiconductor device with
at least one radiation emitting optical semiconductor chip,
an integrated circuit,
exactly two connecting contacts,
wherein the semiconductor device has a variable radiation characteristic which is controlled as a function of a voltage signal both for data transmission and for supplying the semiconductor device which can be applied to the connecting contacts and varied over time and wherein the voltage signal comprises a supply voltage component for supplying the semiconductor device and a data signal component for transmitting data for controlling the radiation characteristic, wherein the voltage signal is a frequency shift keyed signal with a DC component, so that the data feed is modulated via frequency modulation to the voltage supply;
wherein the integrated circuit comprises a decoder which is configured to demodulate the data signal portion of the voltage signal;
wherein the decoder comprises a first bandpass filter, a second bandpass filter and a Schmitt trigger; and
wherein the first bandpass filter has a first pass frequency and is configured to provide a first decoded signal, the second bandpass filter has a second pass frequency and is configured to provide a second decoded signal and the Schmitt trigger is configured to generate a synchronization signal.

18. The semiconductor device according to claim 17, wherein the integrated circuit has a size of about 30×40 µm and a thickness of about 5 µm, and the semiconductor chip has a tear-off point at the end of a projection and/or the integrated circuit has a tear-off point at the end of a projection.

19. A semiconductor device with
at least one radiation emitting optical semiconductor chip,
an integrated circuit,
exactly two connecting contacts,
wherein the semiconductor device has a variable radiation characteristic which is controlled as a function of a voltage signal both for data transmission and for supplying the semiconductor device which can be applied to the connecting contacts and varied over time and wherein the voltage signal comprises a supply voltage component for supplying the semiconductor device and a data signal component for transmitting data for controlling the radiation characteristic, and
wherein the semiconductor chip has a tear-off point at the end of a projection which is a ridge-like projection and/or the integrated circuit has a tear-off point at the end of a projection which is a ridge-like projection.

* * * * *